United States Patent [19]

Marohl et al.

[11] Patent Number: 5,746,460
[45] Date of Patent: May 5, 1998

[54] END EFFECTOR FOR SEMICONDUCTOR WAFER TRANSFER DEVICE AND METHOD OF MOVING A WAFER WITH AN END EFFECTOR

[75] Inventors: Dan A. Marohl, San Jose; Kenny King-Tai Ngan, Fremont, both of Calif.

[73] Assignee: Applied Materials, Inc., Santa Clara, Calif.

[21] Appl. No.: 569,760

[22] Filed: Dec. 8, 1995

[51] Int. Cl.$^6$ .................................................. B65G 65/00
[52] U.S. Cl. .................................... 294/1.1; 414/941
[58] Field of Search .............................. 294/1.1, 27.1, 294/32, 64.1–64.3, 902; 414/935, 936, 939, 941

[56] References Cited

U.S. PATENT DOCUMENTS

| | | | |
|---|---|---|---|
| 3,708,851 | 1/1973 | Vladik | 29/281.1 |
| 4,951,601 | 8/1990 | Maydan et al. | |
| 5,061,144 | 10/1991 | Akimoto et al. | 294/32 |

FOREIGN PATENT DOCUMENTS

| | | | |
|---|---|---|---|
| 0272141 | 6/1988 | European Pat. Off. | |
| 61-140432 | 6/1986 | Japan | 294/64.3 |
| 62-128539 | 6/1987 | Japan | 414/935 |
| 5-47899 | 2/1993 | Japan | 414/941 |
| 6-127621 | 5/1994 | Japan | 414/941 |
| 7022489 | 1/1995 | Japan | |
| 7297262 | 11/1995 | Japan | |

OTHER PUBLICATIONS

IBM Technical Disclosure Bulletin (vol. 24, No. 6), Nov. 1981.

*Primary Examiner*—Dean Kramer
*Attorney, Agent, or Firm*—Fulbright & Jaworski, L.L.P.; J. Scott Denko

[57] ABSTRACT

An end effector for a transfer robot used in connection with the manufacture of semiconductor wafers is provided. The end effector is designed to handle very thin (0.005"–0.010") semiconductor wafers which tend to bow during processing. The robot blade or end effector includes a deep pocket for receiving a bowed wafer. The depth of the pocket may be varied depending upon the degree of bowing in the wafers to be handled. Unlike ordinary wafer transfer devices, the present invention requires the wafer to be transferred with the surface bearing the devices facing down. The deep pocket allows the end effector to contact only the edges of the wafer, thus minimizing any defects across the wafer due to handling. The pocket opening is provided with arcuately shaped sloped wafer contact surfaces to prevent wafer sliding during robot movement.

9 Claims, 5 Drawing Sheets

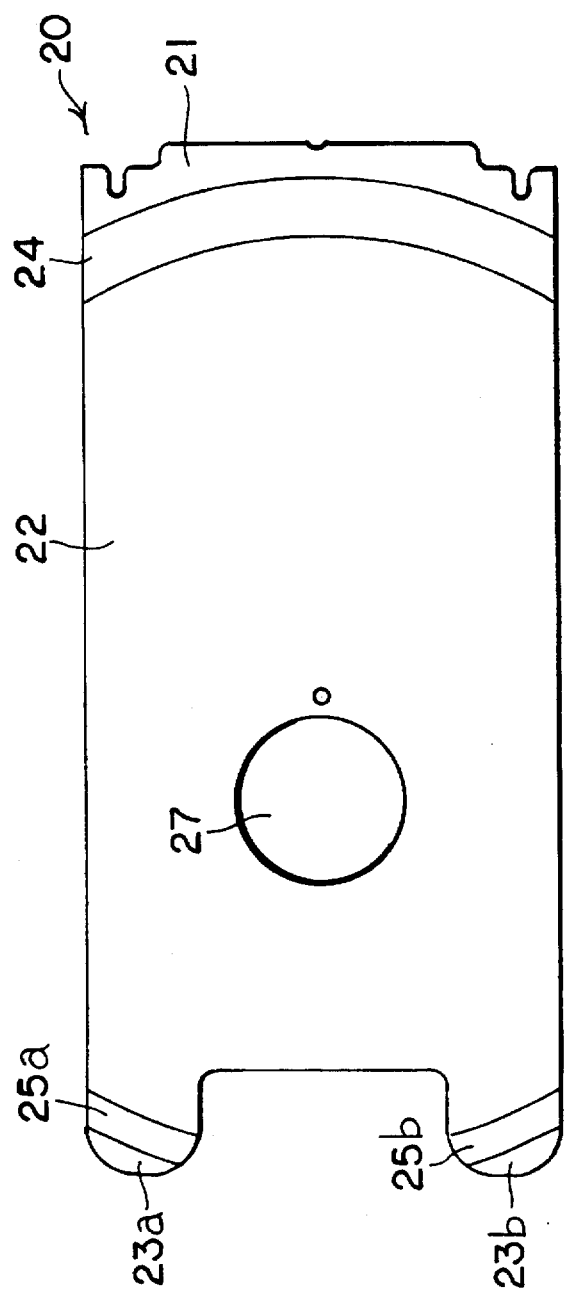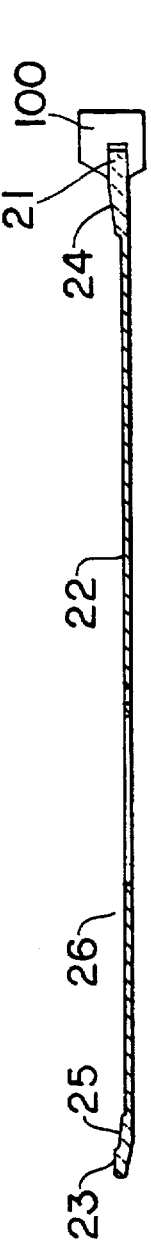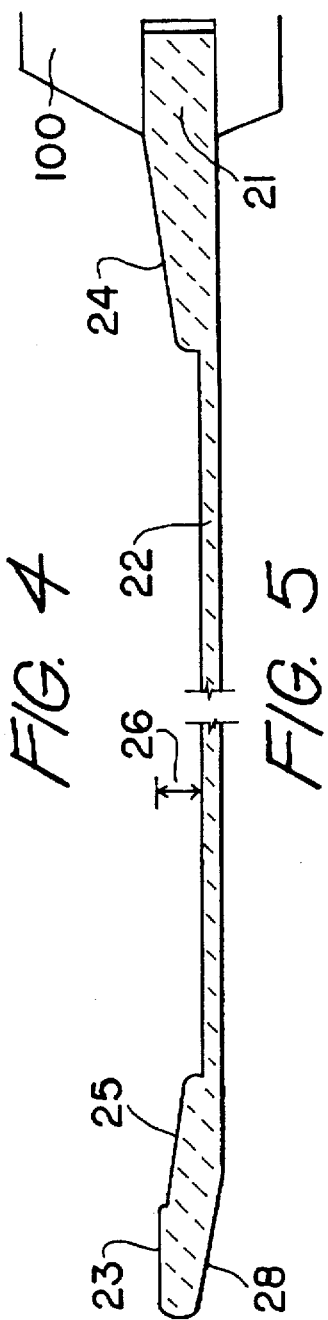

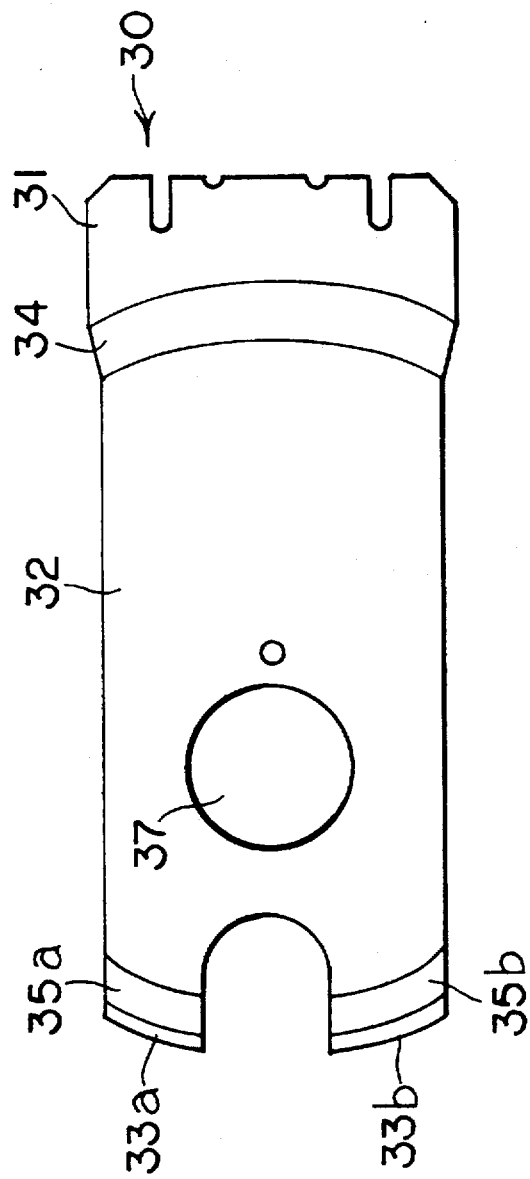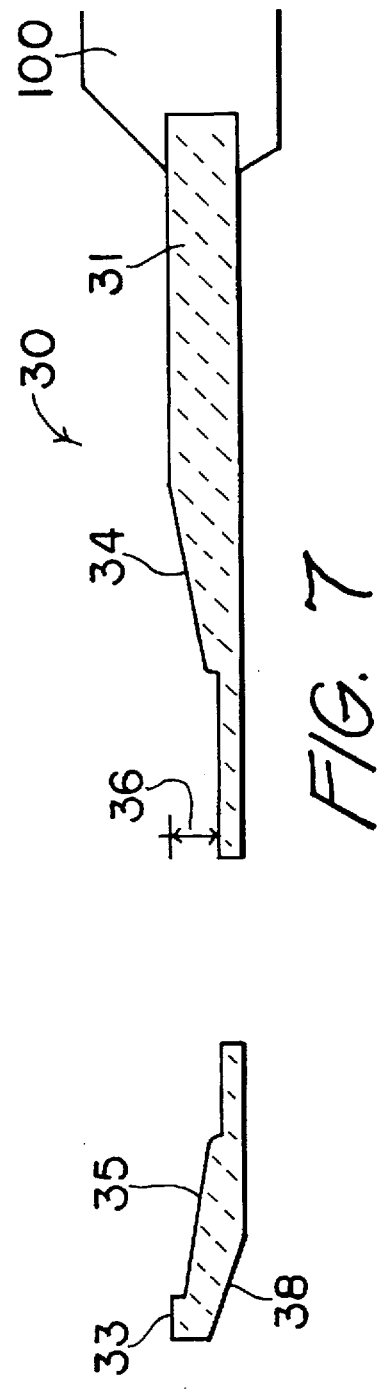

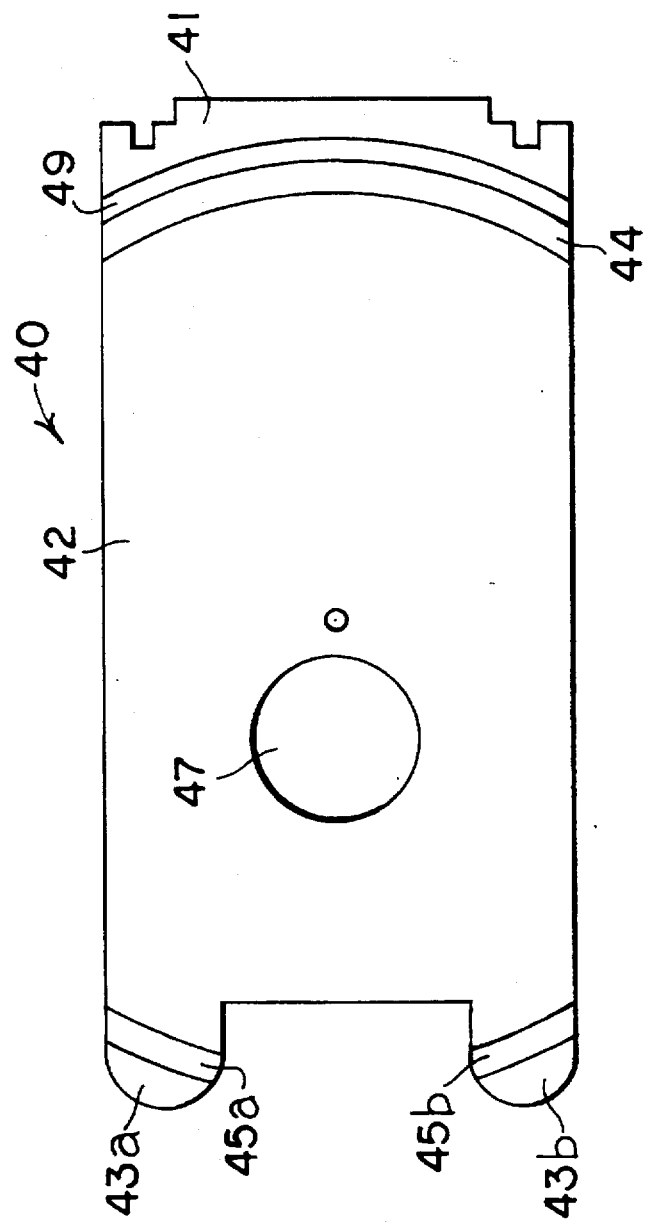
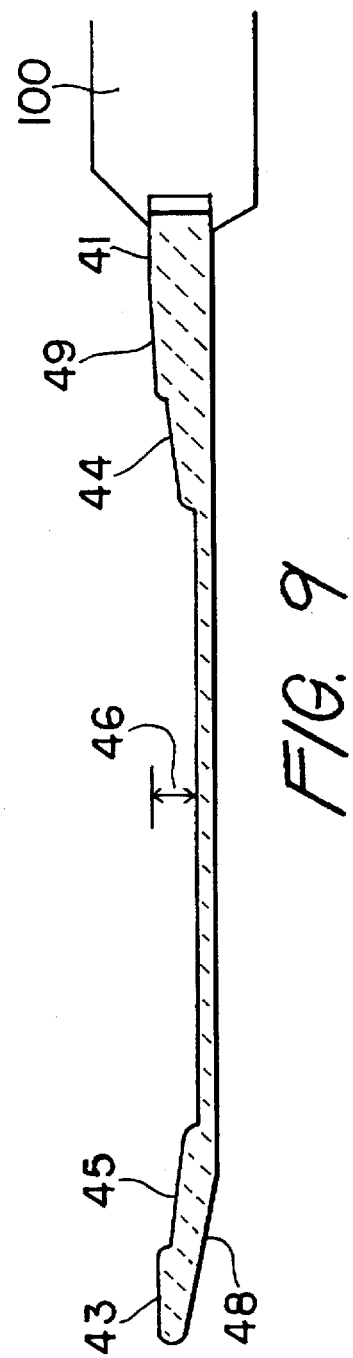

END EFFECTOR FOR SEMICONDUCTOR WAFER TRANSFER DEVICE AND METHOD OF MOVING A WAFER WITH AN END EFFECTOR

BACKGROUND OF THE INVENTION

The present invention relates to the transfer of articles, such as semiconductor wafers, and more particularly to an improved end effector for handling and transferring very thin semiconductor wafers.

The use of robot arms is a well established manufacturing expedient in applications where human handling is inefficient and/or undesired. For example, in the semiconductor arts robot arms are used to handle wafers during various process steps. Such process steps include those which occur in a reaction chamber, e.g. etching, deposition, passivation, etc., where a sealed environment must be maintained to limit the likelihood of contamination and to ensure that various specific processing conditions are provided.

Current practice includes the use of an end effector (also known as a robot blade or carrier) attached to robot arms to load semiconductor wafers from a loading port into various processing ports within a multiple chamber reaction system. The robot arms are then employed to retrieve the wafer from a particular port after processing within an associated process chamber. The wafer is then shuttled by the robot arms to a next port for additional processing. When all processing within the reaction system is complete, the robot arm returns the semiconductor wafer to the loading port and a next wafer is placed into the system by the robot arm for processing. Typically, a stack of several semiconductor wafers is handled in this manner during each process run.

Currently, a conventional robot end effector is used to transfer wafers having a thickness of between about 0.020" and 0.030". Wafers having a normal thickness in this range are generally flat in that they typically do not exhibit more than about 0.005" of bowing. Furthermore, such wafers have sufficient weight to preclude slipping from the end effector as it is swung or moved between process locations attached to a wafer handling chamber.

However, under some circumstances, it is desirable to have a very thin wafer in the range of 0.005" to 0.010". For example, very thin wafers are better heat conductors than wafers of normal thickness. The thin wafer is formed by removing all the excess silicon from the back side of a wafer of normal thickness after the devices have been placed on the front side. The wafer is preferably thinned out by a process known in the art as "backlapping", whereby successive passes are made across the backside of the wafer with a tool until the desired thinness is achieved. Once the wafer is thinned to about 0.005", the backside is coated with gold, which results in a thin wafer with very good heat conductive properties.

Thinning of the wafer can cause problems, however. As the wafer is thinned, the materials forming the devices on the front side of the wafer induce stress and strain on the wafer causing it to bow. In many cases, this bowing is quite extreme. For example, wafers that have been reduced to a thickness of about 0.005" typically exhibit bowing of 0.075", and in extreme cases exhibit bowing of 0.120" or more. Several problems result from the use of prior art end effectors for transfer of these thin, bowed wafers. Because the thin wafers are bowed like a potato chip, the wafer does not sit flat on the end effector. Unless some mechanism is provided to hold the wafer in place, it may become displaced from the end effector during movement of the end effector because the wafer does not have sufficient contact with the end effector. The thin wafer also does not have sufficient weight to prevent it from being displaced from the end effector during end effector movement without some means for holding the wafer in place. Furthermore, as the thin wafers sit in the wafer cassette awaiting capture by the end effector, the bowing of the wafers causes the space between adjacent wafers to be significantly reduced. Use of prior art end effectors results in breakage of a number of wafers because the end effector cannot pass through the narrow space between adjacent bowed wafers in the wafer cassette.

SUMMARY OF THE INVENTION

The present invention is an end effector for an article transfer device. The end effector is preferably attached to a robot for transferring thin, bowed semiconductor wafers within a semiconductor device processing system. The end effector is configured to be inserted into a narrow space between stacked, bowed wafers in a wafer cassette. The end effector is also configured to retain the wafer within a pocket formed therein during wafer transfer.

According to one aspect of the invention, the end effector comprises support means for attaching the end effector to the article transfer device, means for receiving an article to be transferred, and means for retaining the article within the receiving means during transfer of the article. The receiving means may be configured such that only the edge portions of the article contact surfaces of the end effector. The end effector may further include means for capturing an article within the retaining means. The capturing means may further include means for permitting insertion of said end effector capturing means between a pair of closely stacked articles.

According to another aspect, the end effector includes a pocket for receiving an article to be transferred and sloped article contact surfaces surrounding the pocket. The sloped article contact surfaces may be configured to contact the edges of the article and to prevent lateral movement of the article as it is transferred.

A further aspect of the invention is an end effector comprising a rear support mechanism for attaching the end effector to the article transfer device, a pocket extending forward from a front edge of the rear support mechanism for receiving an article therein, and wafer capture shoes located at a forward end of the pocket. A lower, or non-substrate supporting surface of each of said shoes may exhibit a sloped surface.

Another aspect of the present invention is an end effector for an article transfer device comprising a rear support mechanism for attaching the end effector to the article transfer device, a thin flat blade extending from a lower forward edge of the rear support mechanism, an article capture mechanism connected to a forward edge of the thin flat blade, a pocket located above the flat blade portion of the end effector for receiving an article therein, and sloped article contact surfaces surrounding the pocket; said sloped article contact surfaces configured to contact the edges of the article and to prevent lateral movement of the article as it is transferred. According to a further aspect, a second sloped surface may be provided adjacent to the article contact surface formed in said rear support mechanism. A lower leading edge surface of the article capture mechanism may exhibit a sloped surface.

According to yet another aspect of the present invention, an end effector for an article transfer device is provided comprising a rear support mechanism for attaching the end effector to the article transfer device, a sloped article contact surface formed in an upper surface of the rear support mechanism along a forward edge thereof, a pair of elongated rods extending horizontally from a lower surface of the forward edge of the rear support mechanism, and a pair of wafer capture pin caps, each located at a forward end of one of said pair of elongated rods. The sloped article contact surface may be configured to contact the edges of the article and to prevent lateral movement of the article as it is transferred.

BRIEF DESCRIPTION OF THE DRAWINGS

FIG. 3 is a top plan view of an end effector according to a first embodiment of the present invention.

FIG. 4 is a side view in elevation of the end effector shown in FIG. 3.

FIG. 5 is an enlarged sectional side view of the end effector shown in FIGS. 3 & 4.

FIG. 6 is a top plan view of an end effector according to a second embodiment of the present invention.

FIG. 7 is a sectional side view in elevation of the end effector shown in FIG. 6.

FIG. 8 is a top plan view of an end effector according to a third embodiment of the present invention.

FIG. 9 is a sectional side view in elevation of the end effector shown in FIG. 8.

DETAILED DESCRIPTION

Figure 1:
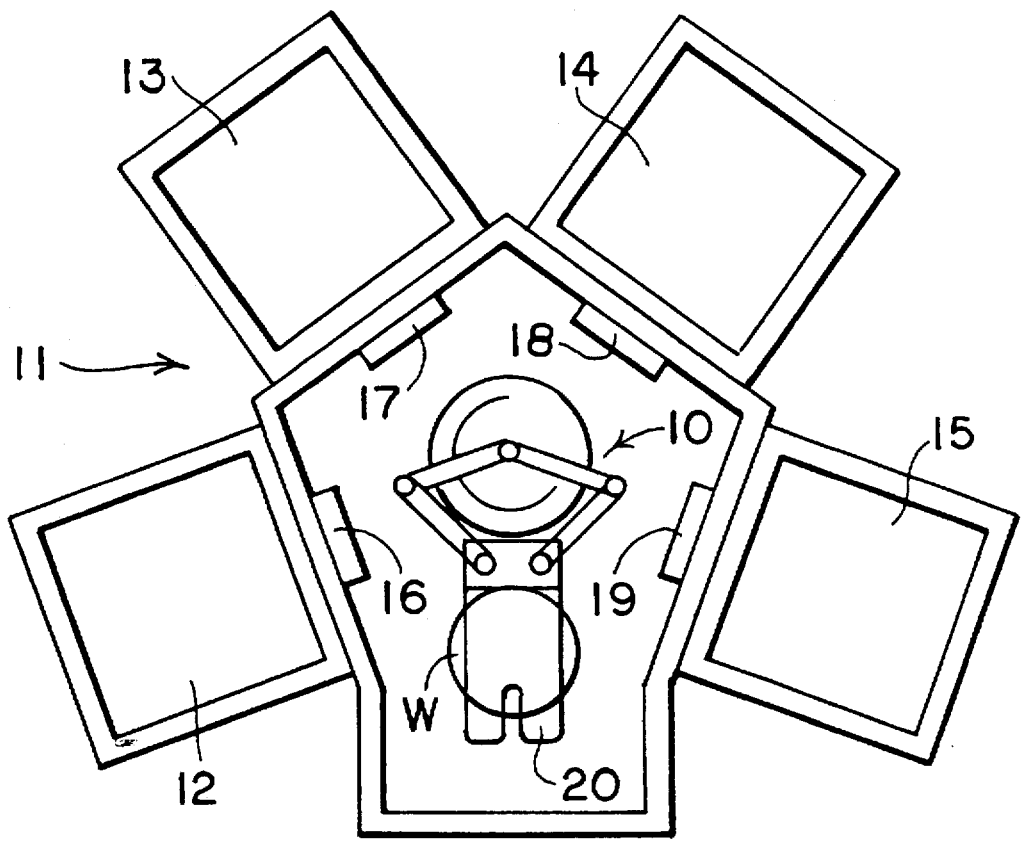
FIG. 1 is a top plan view, partly schematic, of a multiple chamber semiconductor wafer processing system.

The present invention is best understood by referring to the Drawings in connection with review of this Description. The present invention is an end effector for handling and transferring articles. The invention may preferably be used in a semiconductor device processing system, as is used in the manufacture of semiconductors on substrates, including semiconductor wafers and glass plates. For example, the present invention is useful for handling and transferring very thin semiconductor wafers within the processing system.

In FIG. 1, a robot assembly 10 is shown in the context of a processing system. The robot assembly 10 is centrally arranged within a transfer chamber 11 of the processing system. The robot assembly 10 is arranged within the transfer chamber 11 such that semiconductor wafers W can be transferred to adjacent processing chambers 12, 13, 14, 15 through valves 16, 17, 18, 19, respectively. The robot assembly may, for example, comprise a frog-leg mechanism as shown in FIG. 1. Alternatively, the robot assembly may comprise any of a variety of known mechanical mechanisms for effecting linear extension into and out of the various process chambers. An end effector 20 is attached to the extendable arms of the robot assembly 10. The end effector 20 is configured to carry the wafer W on an upper surface thereof as the wafer is transferred through the processing system.

Figure 2:
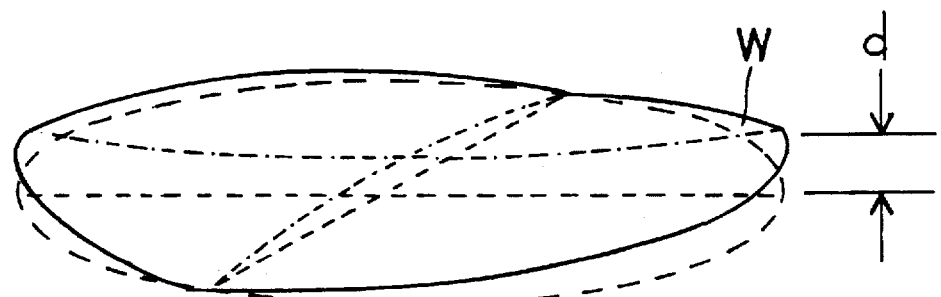
FIG. 2 is a perspective view of a thin semiconductor wafer.

As shown in FIG. 2, a thin wafer W may be bowed a distance d. For example, a 0.005" thin wafer may be bowed as much as 0.075". However, depending upon the wafer thickness and the type and thickness of film on the wafer, the amount of bowing can vary. In extreme circumstances, the wafer may be bowed as great as 0.120". The thin wafer W is formed by removing all the excess silicone from the back side of the wafer after the devices have been placed on the front side. The wafer is preferably thinned out by a process known in the art as "backlapping", whereby successive passes are made across the backside of the wafer with a tool until the desired thinness is achieved. As the wafer is thinned, the devices on the front induce stress and strain on the wafer causing it to bow, as shown in FIG. 2.

As shown in FIGS. 3–5, an end effector 20 according to a first embodiment of the present invention comprises a rear support mechanism 21 for attaching the end effector 20 to an article transfer device, such as a wafer transfer robot 100, a thin flat blade 22 extending from the lower front edge of the support mechanism, and a wafer capture mechanism comprising a pair of wafer capture shoes 23a, 23b located proximal to the forward edge of the end effector 20. A wafer contact slope 24 is formed proximal to the forward edge of the rear support mechanism 21, and wafer contact slopes 25a, 25b are formed on the trailing edges of the wafer capture shoes 23a, 23b, respectively, such that a pocket 26 is formed in an upper surface of the end effector. An opening 27 may be formed in the blade 22 to permit lifting pins (not shown) to lift the wafer from the end effector once it is situated in a process chamber. The lower leading edge of the end effector 20 may exhibit a sloped surface 28 to permit insertion of the end effector between closely stacked thin wafers.

As shown in FIG. 3, the wafer contact surfaces 24, 25a, 25b are arcuately shaped. This arc shape cooperates with the slope of wafer contact surface to form a funnel-like mechanism for retaining the thin wafer within the pocket as the end effector is moved. The funnel-like mechanism holds the wafer in the center of the end effector and prevents it from sliding off the end effector as it rotates. No matter how severely bowed a wafer is, it will always contact at least one point on each of the wafer contact surfaces 24, 25a, 25b, respectively, so long as the warpage is not so extreme that the wafer crowns over and contacts the edges of the end effector between the ends.

Shown in FIGS. 6–7 is one preferred embodiment of an end effector 30 for handling 6" diameter, thin circular wafers. The end effector 30 is similar to the end effector shown in FIGS. 3–5, wherein like reference numerals indicate like components. The end effector 30 comprises a rear support mechanism 31 for attaching the end effector 30 to an article transfer device, such as a wafer transfer robot, a thin flat blade 32 extending from the lower front edge of the support mechanism, and a wafer capture mechanism comprising a pair of wafer capture shoes 33a, 33b located proximal to the forward edge of the end effector 30. A wafer contact slope 34 is formed proximal to the forward edge of the rear support mechanism 31, and wafer contact slopes 35a, 35b are formed on the trailing edges of the wafer capture shoes 33a, 33b, respectively, such that a pocket 36 is formed in an upper surface of the end effector. According to a preferred embodiment, the wafer contact surfaces 34, 35a, 35b exhibit a slope of about 10° from the horizontal plane. An opening 37 may be formed in the blade 32 to permit lifting pins (not shown) to lift the wafer from the end effector once it is situated in a process chamber. The lower leading edge of the end effector 30 may exhibit a sloped surface 38 to permit insertion of the end effector between closely stacked thin wafers. According to a preferred embodiment, the slope of the surface 38 is about 21° from the horizontal plane.

FIGS. 8–9 show another preferred embodiment of an end effector 40 for handling 8" diameter, thin circular wafers. The end effector 40 is similar to the end effectors shown in FIGS. 3–5 and 6–7, wherein like reference numerals indicate like components. The end effector 40 comprises a rear support mechanism 41 for attaching the end effector 40 to an article transfer device, such as a wafer transfer robot, a thin flat blade 42 extending from the lower front edge of the support mechanism, and a wafer capture mechanism comprising a pair of wafer capture shoes 43a, 43b located proximal to the forward edge of the end effector 40. A wafer contact slope 44 is formed proximal to the forward edge of the rear support mechanism 41, and wafer contact slopes 45a, 45b are formed on the trailing edges of the wafer capture shoes 43a, 43b, respectively, such that a pocket 46 is formed in an upper surface of the end effector. According to a preferred embodiment, the wafer contact surfaces 44, 45a, 45b exhibit a slope of about 9° from the horizontal plane. An opening 47 may be formed in the blade 42 to permit lifting pins (not shown) to lift the wafer from the end effector once it is situated in a process chamber. The lower leading edge of the end effector 40 may exhibit a sloped surface 48 to permit insertion of the end effector between closely stacked thin wafers. According to a preferred embodiment, the slope of the surface 48 is about 12° from the horizontal plane.

The 8" wafer end effector shown in FIGS. 8–9 also exhibits a second sloped surface 49 formed in the upper surface of the rear support mechanism 41 adjacent to the sloped article contact surface 44. The second sloped surface is needed because an 8" end effector extends considerably farther into the cassette than a 6" end effector. Due to the additional extension of the 8" end effector into the cassette, it is possible that a severely bowed wafer may contact the non-sloped portion of the end effector causing dislocation or breakage of the wafer. To overcome this problem, the second sloped surface 49 is needed to prevent further wafer/end effector contact. According to a preferred embodiment, the slope of the second sloped surface 49 is about 4° from the horizontal plane.

The end effectors shown in FIGS. 3–9 are preferably formed of a rigid material, which is necessary to ensure that the end effector is straight, flat and does not bend. This is necessary due to the lack of clearance between thin wafers stacked in a wafer cassette. If the end effector is not straight and flat, its leading edge may bump into a thin wafer as it attempts to retrieve a wafer from the cassette, causing the bumped wafer, which is very fragile due to the thinness, to break. To ensure straightness of the end effector, it is necessary to construct the end effector of a substantially inflexible material that will not bend and is also highly heat resistant. Examples of such substantially inflexible materials include ceramic, ceramic based compounds, silicon, silicon compounds, and quartz.

Additionally, to allow insertion of the end effector between closely stacked thin wafers, the blade portion of the end effector must be very thin. According to one preferred embodiment the blade portion of the end effector is only 0.040" thick. The sloped lower leading edge of the end effector also facilitates insertion between two closely stacked wafers. The tapered edge allows the end effector to slice between adjacent stacked wafers better than a blunt leading edge which would likely smash into one of the wafers as it attempts to pass between them.

Normally, a wafer is carried on an end effector with the devices facing upwardly. However, in the present invention where thin wafers having devices on a front side and a layer of gold on the backside are transferred, the wafers are transferred by the end effector upside down. That is, the devices on the front side of the wafer are facing down toward the blade portion of the end effector. Therefore, to avoid damage to the devices, it is extremely important that the devices on the lower surface of the wafer not come in contact with the blade portion of the end effector. This is accomplished by providing a pocket on the portion of the end effector between the ends which is deep enough to accommodate the severely bowed wafers. For example, where the maximum bowing of a wafer is expected to be 0.075", a pocket having a depth of 0.080" would accommodate the wafer without damaging the delicate devices on the lower surface. The depth of the pocket can be varied depending upon the amount of bowing shown in the wafer. The pocket allows only the edges of the wafer to contact the end effector along the sloped article contact surfaces, thereby minimizing defects across the wafer caused by handling.

The front wafer capture shoes (i.e. 23a, 23b) aid in wafer removal from the cassette. The upper surface of each shoe 23a, 23b extends above the corresponding sloped article contact surface 25a, 25b by about 0.02" to 0.03" to form a lip which engages a rear edge of the wafer, i.e., the portion of the wafer furthest from the end effector support arm 100, in the cassette once the robot end effector has been fully extended into the cassette. As previously mentioned, the lower leading edge of each shoe 23a, 23b exhibits a sloped surface 28 to permit insertion of the end effector 20 between closely stacked thin wafers.

Figure 10:
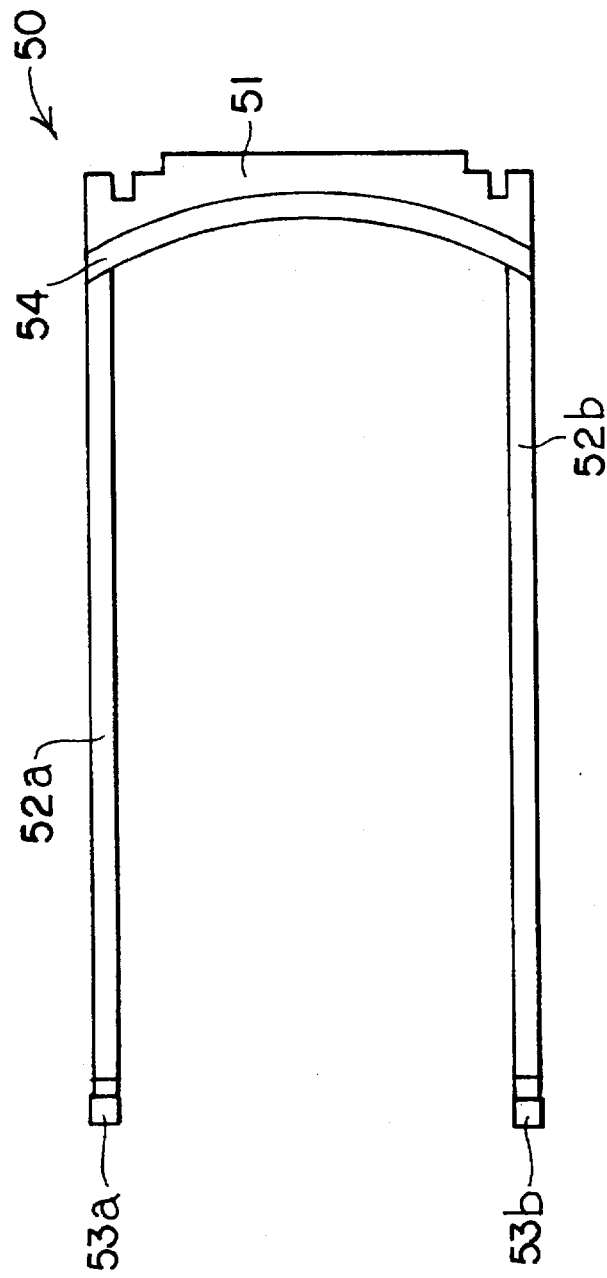
FIG. 10 is a top plan view of an end effector according to a fourth embodiment of the present invention.
Figure 11:
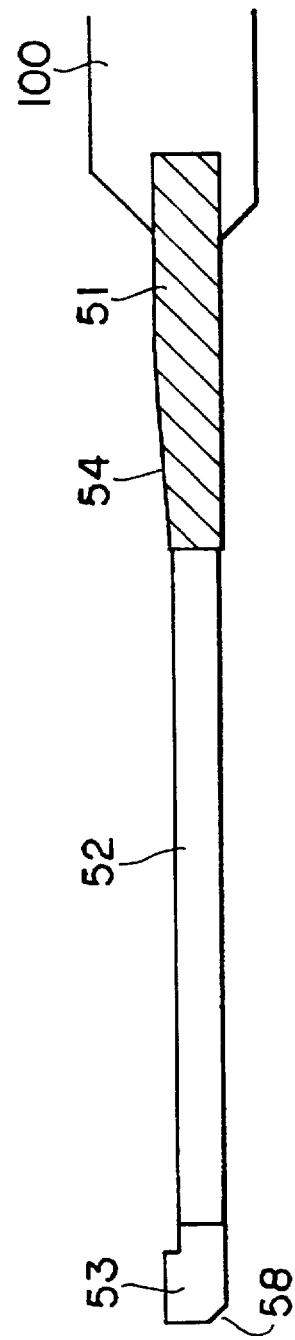
FIG. 11 is a sectional side view in elevation of the end effector shown in FIG. 10.

An end effector 50 according to a further alternative embodiment of the present invention is shown in FIGS. 10–11. The end effector 50 comprises a rear support mechanism 51 for attaching the end effector 50 to an article transfer device, such as a wafer transfer robot, a pair of elongated rods 52a, 52b extending from the lower front edge of the support mechanism 51, and a pair of pin caps 53a, 53b located at the forward ends of the elongated rods 52a, 52b, respectively, for capturing and retaining a wafer within the end effector. An arc shaped wafer contact slope 54 is formed proximal to the forward edge of the rear support mechanism 51. The arc shape and the slope cooperate to form a funnel-like mechanism for retaining the thin wafer within the pocket as the end effector is moved. According to one preferred embodiment, the wafer contact surface 54 exhibits a slope of about 4° from the horizontal plane. The lower leading edge of the end effector 50 may exhibit a chamfer 58 to facilitate insertion of the end effector between closely stacked thin wafers. By using a pair of elongated rods 52a, 52b, the midsection of the end effector is removed, thus permitting transfer of bowed wafers of almost any degree without contact between the lower surface of the wafer and the surfaces of the end effector 50.

The elongated rods 52a, 52b are preferably formed from a highly heat resistant, substantially rigid material, which is necessary to ensure that the end effector is straight and does not bend. Examples of such substantially inflexible materials include ceramic, ceramic based compounds, silicon, silicon compounds and quartz. The rear support mechanism 51 and the pin caps 53a, 53b are not subject to the same bending moments as the rods, and therefore can be made from a variety of metals and metal alloys. According to a preferred embodiment, the rear support mechanism 51 and the pin caps 53a, 53b are formed from KOVAR®, an alloy consisting primarily of iron, nickel and cobalt, and the elongated rods 52a, 52b are formed of ceramic. The ceramic rods 52a, 52b are brazed to the KOVAR® support mechanism 51 and pin caps 53a, 53b. Due to the similarities in heat expansion properties between KOVAR® and ceramic, a very good connection results from a braze of these two materials.

The end effector of the present invention can be designed to handle wafers of all shapes and sizes. Preferably, the end effector is intended to handle thin wafers in the range of 0.005" to 0.010" in thickness, but the end effector also handles regular thick wafers very well. The end effector is also primarily designed to handle circular wafers of either 6" or 8" diameter. Embodiments for 12" (300 mm) wafers, and non-circular wafers such as glass substrates are also contemplated.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

I claim:

1. An end effector for an article transfer device comprising:

a rear support mechanism for attaching the end effector to the article transfer device;

a pocket extending forward from a front edge of the rear support mechanism for receiving an article therein;

wafer capture shoes projecting forward through a peripheral forward end of the pocket; a lower surface of each of said shoes exhibiting a sloped surface.

2. An end effector for an article transfer device comprising:

a rear support mechanism for attaching the end effector to the article transfer device;

a sloped article contact surface formed in an upper surface of the rear support mechanism along a forward edge thereof; said sloped article contact surface configured to contact the edges of the article and to prevent lateral movement of the article as it is transferred;

a pair of substantially parallel elongated rods extending horizontally from a lower surface of the forward edge of the rear support mechanism; and a pair of wafer capture pin caps, each located at a forward end of one of said pair of elongated rods.

3. The end effector according to claim 2, wherein said substantially parallel elongated rods are formed from a rigid material.

4. The end effector according to claim 3, wherein said substantially parallel elongated rods are formed from ceramic or a ceramic compound.

5. The end effector according to claim 4, wherein said rear support mechanism and said pin caps are formed from a metal alloy.

6. The end effector according to claim 5, wherein said metal alloy comprises KOVAR®.

7. The end effector according to claim 6, wherein said substantially parallel elongated rods are connected to said rear support mechanism and said pin caps by brazing.

8. The end effector according to claim 2, wherein a lower leading edge of each of said pin caps exhibits a chamfer.

9. The end effector according to claim 2, wherein said sloped article contact surface exhibits a slope of about 4° from the horizontal plane.

* * * * *